United States Patent
Tung

(10) Patent No.: US 7,114,861 B1
(45) Date of Patent: Oct. 3, 2006

(54) LASER MODULE WITH TRIMMING CAPACITY

(75) Inventor: Hsin-Chih Tung, Chung Li (TW)

(73) Assignee: Lecc Technology Co., Ltd., Tao Yuan Hsien (TW)

(*) Notice: Subject to any disclaimer, the term of this patent is extended or adjusted under 35 U.S.C. 154(b) by 34 days.

(21) Appl. No.: 11/124,038

(22) Filed: May 9, 2005

(51) Int. Cl.
*G02B 6/12* (2006.01)

(52) U.S. Cl. .................. 385/92; 372/100; 372/101

(58) Field of Classification Search .......... 385/92; 372/100, 101
See application file for complete search history.

(56) References Cited

U.S. PATENT DOCUMENTS

| | | | | |
|---|---|---|---|---|
| 4,431,267 A | * | 2/1984 | Finck et al. | 362/191 |
| 4,923,281 A | * | 5/1990 | Krichever et al. | 359/826 |
| 5,121,188 A | * | 6/1992 | Patridge et al. | 257/680 |
| 5,191,629 A | * | 3/1993 | Kaiser | 385/90 |
| 5,425,299 A | * | 6/1995 | Teetzel | 89/14.4 |
| 5,584,569 A | * | 12/1996 | Huang | 362/288 |
| 5,694,713 A | * | 12/1997 | Paldino | 42/115 |
| 5,697,700 A | * | 12/1997 | Huang | 362/259 |
| 5,787,631 A | * | 8/1998 | Kendall | 42/116 |
| 5,845,982 A | * | 12/1998 | Shih | 353/42 |
| 5,878,073 A | * | 3/1999 | Wu | 372/108 |
| 5,897,200 A | * | 4/1999 | Ho | 362/259 |
| 5,900,617 A | * | 5/1999 | Dvorkis et al. | 235/472.01 |
| 6,007,218 A | * | 12/1999 | German et al. | 362/259 |
| 6,230,431 B1 | * | 5/2001 | Bear | 42/117 |
| 6,343,092 B1 | * | 1/2002 | Naoe et al. | 372/108 |
| 6,491,225 B1 | * | 12/2002 | Dvorkis et al. | 235/472.01 |
| 6,513,251 B1 | * | 2/2003 | Huang et al. | 33/286 |
| 6,549,228 B1 | * | 4/2003 | Watanabe | 347/245 |
| 6,905,751 B1 | * | 6/2005 | Jauregui | 428/89 |
| 6,913,402 B1 | * | 7/2005 | Bohlin et al. | 385/93 |
| 6,938,350 B1 | * | 9/2005 | Hersey | 33/286 |
| 2004/0182929 A1 | * | 9/2004 | Aoshima et al. | 235/454 |
| 2005/0041705 A1 | * | 2/2005 | Chien et al. | 372/38.01 |

FOREIGN PATENT DOCUMENTS

TW     92215753     8/2003

* cited by examiner

*Primary Examiner*—Ellen E. Kim
(74) *Attorney, Agent, or Firm*—Rosenberg, Klein & Lee

(57) ABSTRACT

A laser module with trimming capacity has a base having an indented portion formed thereon so as to be non-annular in configuration. A lens is disposed inside the base. A laser diode is disposed inside the base and behind the lens. A printed circuit board electrically connects the laser diode. Alternatively, the base has a polygonal rotation portion, instead of the indented portion, disposed on an external surface thereof.

12 Claims, 6 Drawing Sheets

LASER MODULE WITH TRIMMING CAPACITY

BACKGROUND OF THE INVENTION

1. Field of the Invention

The present invention relates to a laser module with trimming capacity, and particularly relates to a laser module adapted for an orientation apparatus and operated with fine-tuning capacity.

2. Background of the Invention

A conventional circular saw machine is implemented for cutting materials rapidly and effectively. There are several kinds of circular saws, such as a manual circular saw machine, which is used for orientating materials and having a circular saw blade that manually pushed; and an automatic circular saw machine, which can orientate a circular saw blade thereof and automatically push materials. Before cutting the materials, a cutting line is marked on the materials and the blade can work along the cutting line. To prevent missing the cutting line, a laser module is provided on the blade for aligning the cutting line.

"A laser orientation module of a circular saw machine" is disclosed in Taiwan Publication Patent No. M240285, published on Aug. 11, 2004. The machine includes a cover, a laser module, and a power supply and control unit. The laser module and the power supply and control unit are disposed in the cover and electrically connected to each other. The laser orientation module can be disposed on a central portion of a blade of the circular saw machine. When the circular saw machine is turned on, plural LEDs of the laser module emit light, and the light can be converged by a lens to focus a cutting line marked on a prepared material. Thus, the displacement between the blade and the prepared material can be avoided effectively. However, the laser module disposed inside the cover makes fine-tuning difficult. Low precision in cutting thus occurs and causes inconvenience in practice.

SUMMARY OF INVENTION

A laser module with trimming capacity can provide a very precise alignment in accordance with fine tuning capacity and can be applied to various laser orientation modules.

The laser module with trimming capacity includes a hollow base, having an indented portion formed thereon so as to be non-annular in configuration; a lens disposed inside the base; a laser diode disposed inside the base and in rear of the lens; and a printed circuit board electrically connecting the laser diode.

The laser module with trimming capacity includes a hollow base having a polygonal rotation portion disposed on an external surface thereof so as to be non-annular in configuration; a lens disposed inside the base; a laser diode disposed inside the base and behind the lens; and a printed circuit board electrically connecting the laser diode.

To provide a further understanding of the invention, the following detailed description illustrates embodiments and examples of the invention. Examples of the more important features of the invention have thus been summarized rather broadly in order that the detailed description thereof that follows may be better understood, and in order that the contributions to the art may be appreciated. There are, of course, additional features of the invention that will be described hereinafter, which will form the subject of the claims appended hereto.

BRIEF DESCRIPTION OF THE DRAWINGS

These and other features, aspects, and advantages of the present invention will become better understood with regard to the following description, appended claims, and accompanying drawings, where:

DETAILED DESCRIPTION OF THE EMBODIMENTS

Figure 1:
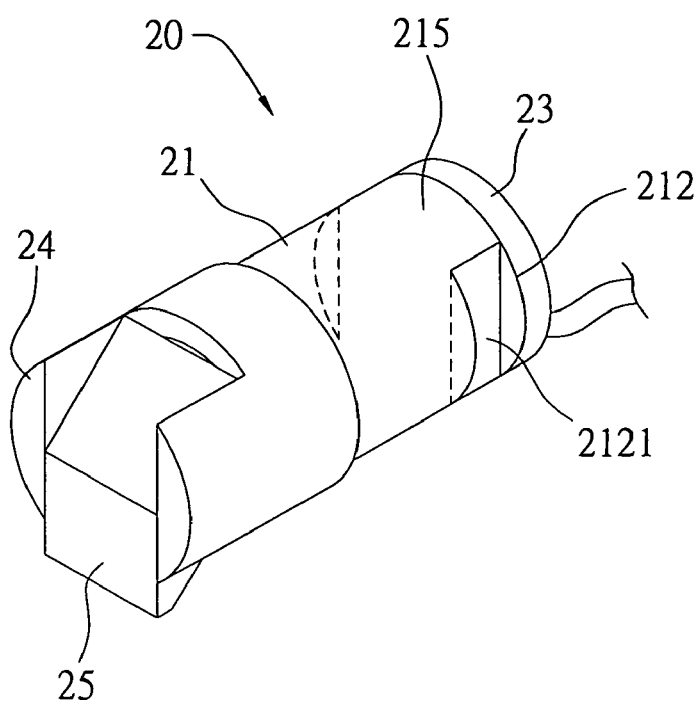
FIG. 1 is a perspective view of a first embodiment of a laser module with trimming capacity according to the present invention.
Figure 2:
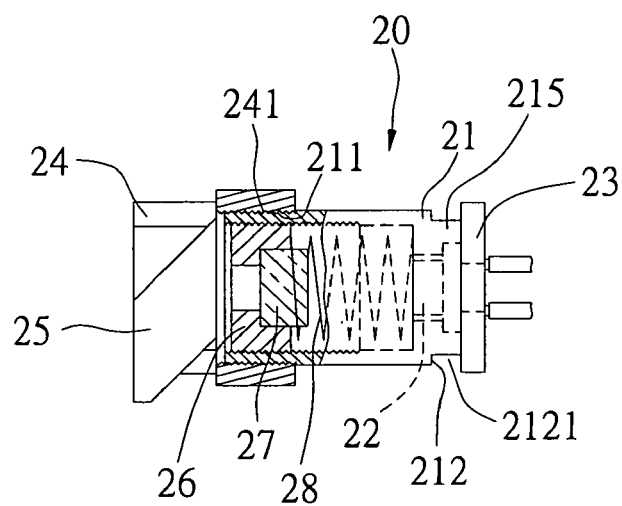
FIG. 2 is a cross-sectional profile of the first embodiment of the laser module with trimming capacity according to the present invention.
Figure 3:
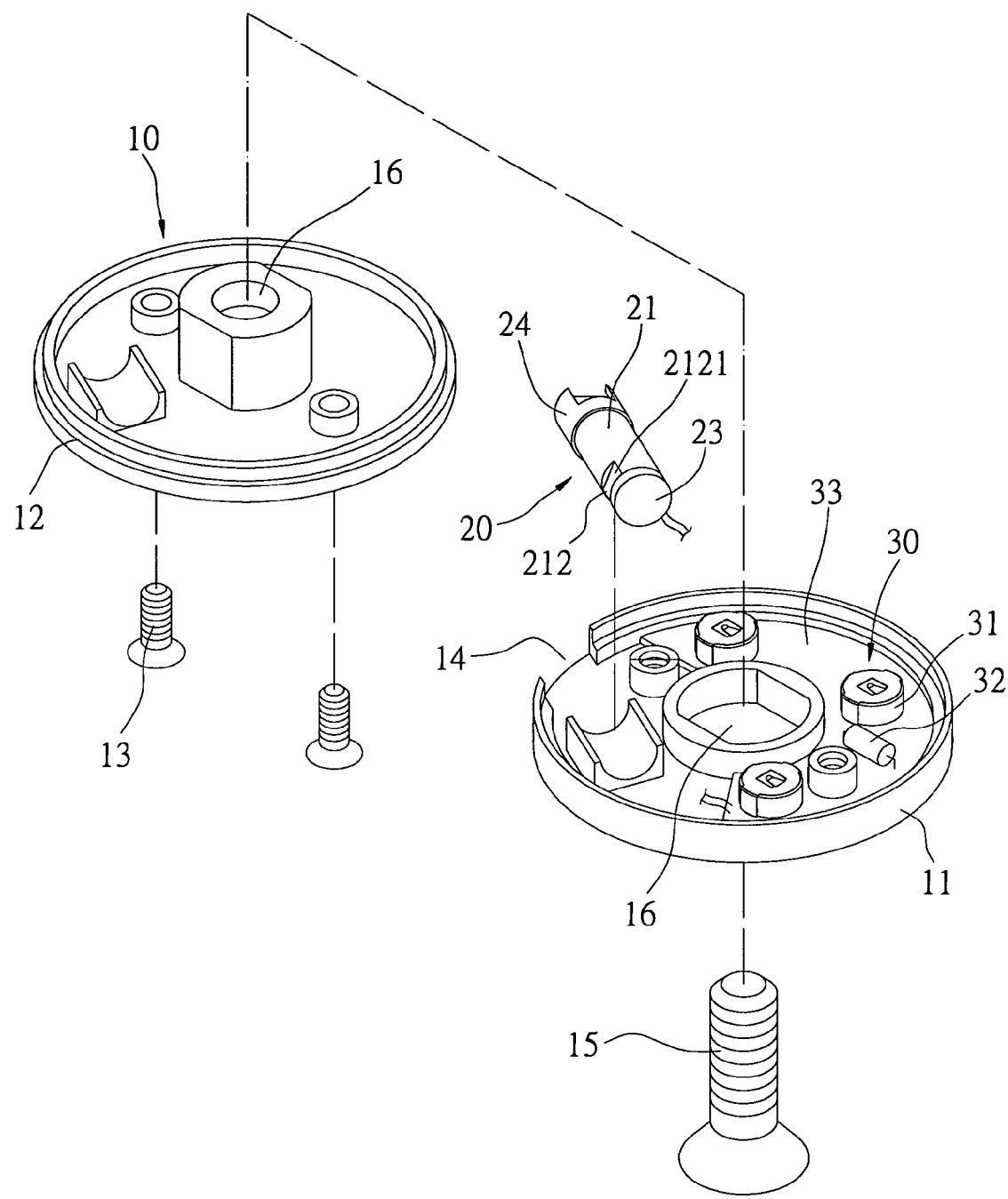
FIG. 3 is a perspective view of the laser module with trimming capacity applied to a laser orientation module according to the present invention.

With respect to FIGS. 1 to 3, a laser module 20 with trimming capacity according to the present invention can be adapted for a laser orientation module of a circular saw machine. The laser orientation module includes a cover 10, the laser module 20, and a power supply and control unit 30 electrically connected to the laser module 20 for driving the laser module 20. The cover 10 includes an upper cover 11 and a lower cover 12 screwed to the upper cover 11 via two screw bolts 13. The cover 10 has a laser hole 14 formed on a circumference thereof. The cover 10 is secured to the circular saw machine by a screw bolt 15 through a central hole 16 thereof.

The laser module 20 and the power supply and control unit 30 are disposed inside the cover 10. The power supply and control unit 30 includes a battery 31, a vibration switch 32 and a printed circuit board 33. The cover 10 and the unit 30 will be not described furthermore due to the scope according to the present invention.

The laser module 20 includes a base 21, a laser diode 22, a printed circuit board 23, a lens holder 24, a prism 25, a front sleeve 26, a lens 27 and a spring 28. The base 21 is a hollow base with two opposite openings. The base 21 has a first screw thread portion 211 formed on an external surface of a front portion thereof, and at least one indented portion 212 formed on/near a rear portion thereof, so as to be non-annular in configuration. In this embodiment, the indented portion 212 is a recess 2121 formed on each lateral sides of the rear portion of the base 21, and a budge 215 being non-annular and formed between the recess 2121. The configuration of the indented portion 212 is not limited, and just needs to be a non-annular shape formed on the base 21 for implementing insertions and rotation.

The front sleeve 26, the lens 27 and the spring 28 are disposed inside the base 21. The front sleeve 26 is screwed to the base 21. The lens 27 is secured to the front sleeve 26. The spring 28 abuts against the front sleeve 26 via an end thereof. The lens 27 is in front of the laser diode 22.

The laser diode 22 is disposed inside the base 21. The printed circuit board 23 can be, for example, circular. The printed circular printed 23 is disposed to the rear portion of the base 21, so that the printed circuit board 23 can be exposed out of the base 21. The printed circuit board 23 electrically connects the laser diode 22 and the power supply and control unit 30 for driving the laser diode 22 of the laser module 20.

The lens holder 24 is disposed on the front portion of the base 21. The lens holder 24 is hollow and has two opposite openings. The prism 25 is embedded in the lens holder 24. The lens holder 24 has a second screw thread portion 241 corresponding to the first one 211. The lens holder 24 can connect with the base 21 by mating the first and the second screw thread portion 211 and 241. Therefore, the laser module with trimming capacity is assembled.

The light from the laser diode 22 can be converged by the lens 27 and refracted outwardly by the prism 25. The light from the laser module 20 can precisely align with a cutting line marked on a prepared material.

Figure 4:
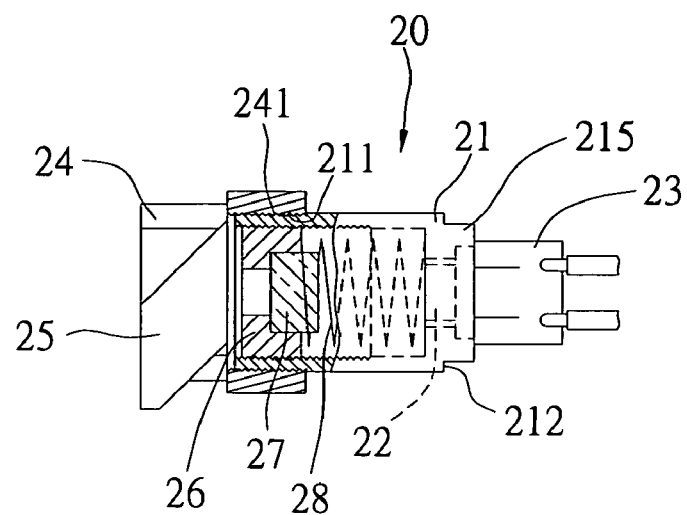
FIG. 4 is a cross-sectional profile of a second embodiment of the laser module with trimming capacity according to the present invention.

Referring to FIG. 4, the printed circuit board 23 can be another configuration.

Figure 5:
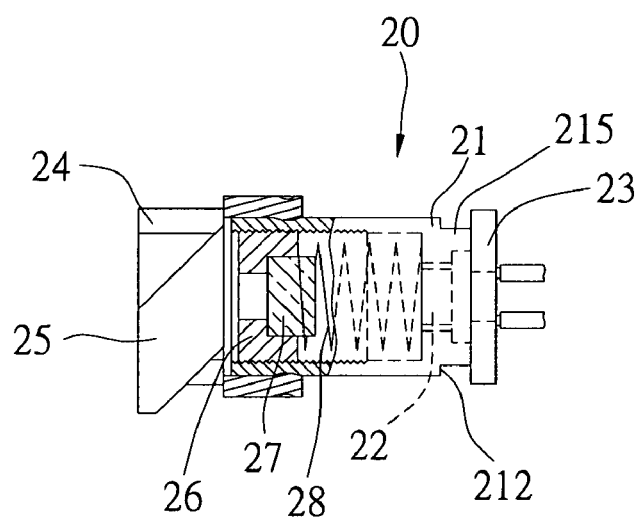
FIG. 5 is a cross-sectional profile of a third embodiment of the laser module with trimming capacity according to the present invention.
Figure 6:
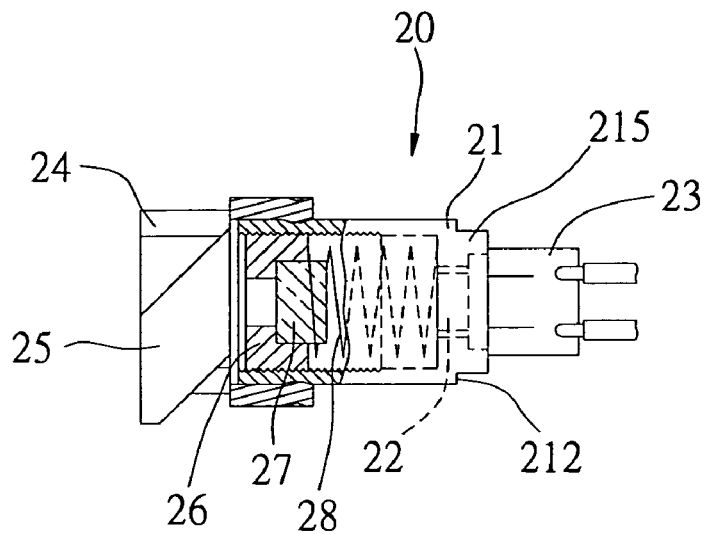
FIG. 6 is a cross-sectional profile of a fourth embodiment of the laser module with trimming capacity according to the present invention.

Referring to FIGS. 5 and 6, the lens holder 24 can be sleeved to a front portion of the base 21 tightly.

Figure 7:
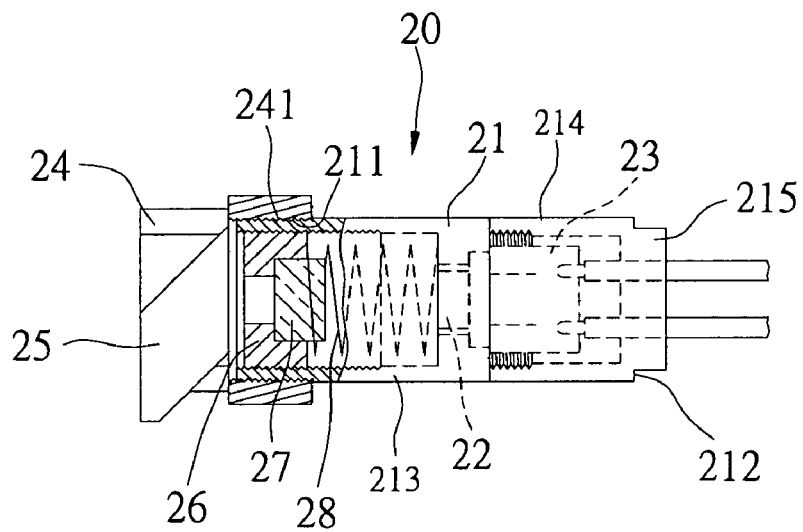
FIG. 7 is a cross-sectional profile of a fifth embodiment of the laser module with trimming capacity according to the present invention.

Referring to FIG. 7, the printed circuit board 23 can be disposed inside the base 21. Furthermore, the base 21 can be attached by two pieces, meaning the base 21 includes a front base 213 and a rear base 214.

The indented portion 212 of the base 21 is used for the implements inserted to do trimmings. The budge 215 is also squeezed to rotate the base 21. Thus, the laser module 20 can be adjusted after being set inside the cover 10.

Figure 8:
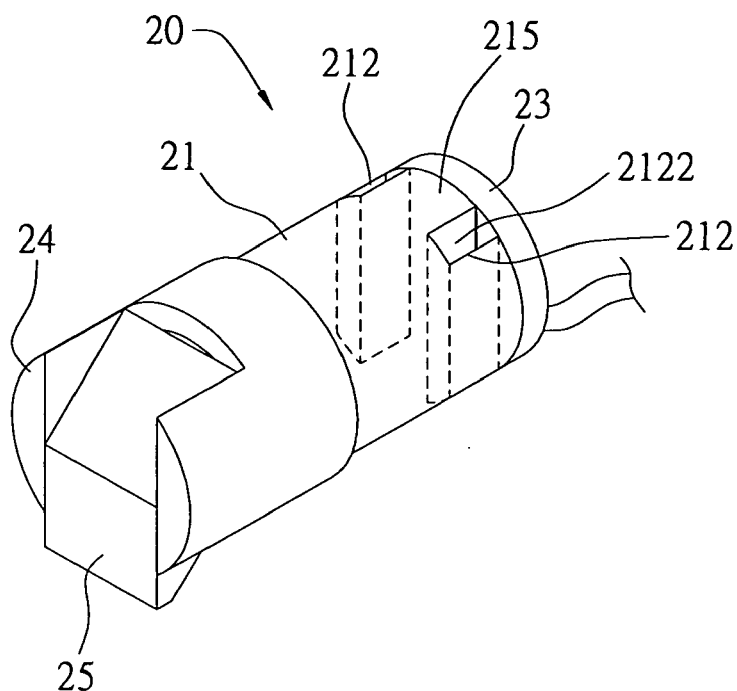
FIG. 8 is a perspective view of a sixth embodiment of the laser module with trimming capacity according to the present invention.

Referring to FIG. 8, the configuration and the location of the indented portion 212 of the base 21 can be verified. The indented portion 212 can be a recess 2122 formed at the rear portion of the base 21 vertically, and the budge 215 is formed thereby.

Figure 9:
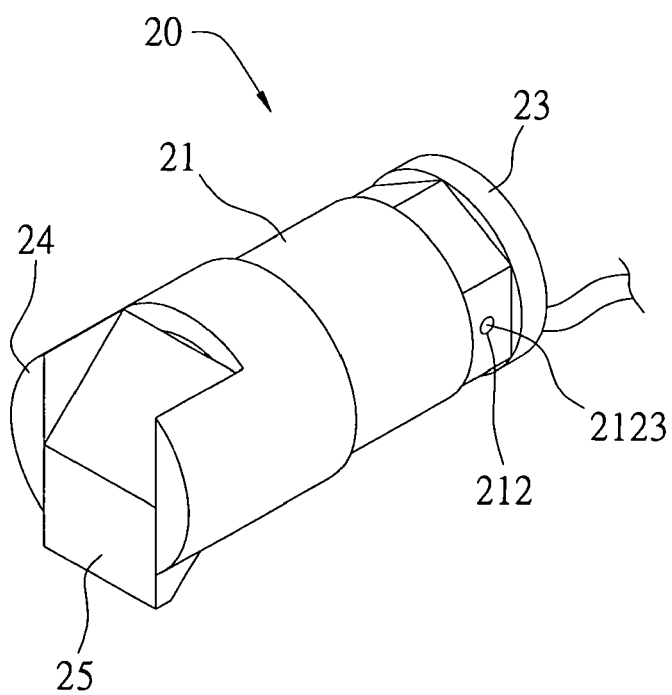
FIG. 9 is a perspective view of a seven embodiment of the laser module with trimming capacity according to the present invention.

Referring to FIG. 9, the indented portion 212 can be a through hole 2123 formed in the rear portion of the base 21 for installing the implements and rotating the base 21. Therefore, the laser module 20 can be adjusted after being set inside the cover 10.

Figure 10:
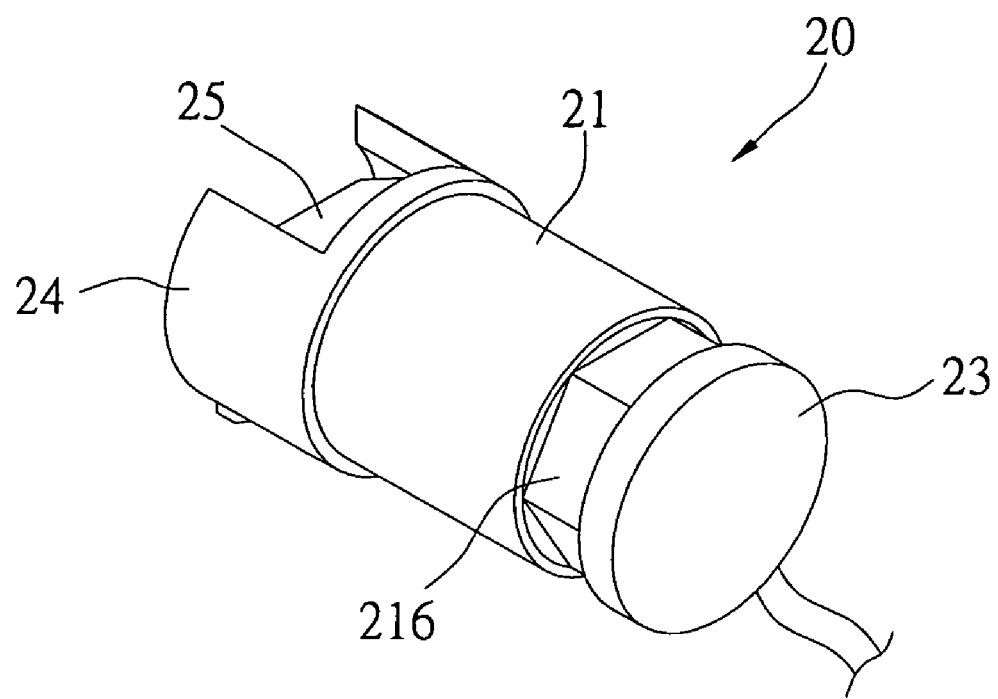
FIG. 10 is a perspective view of a sixth embodiment of the laser module with trimming capacity according to the present invention.

Referring to FIG. 10, the base 20 has a polygonal rotation portion 216 instead of the indented portion 212 disposed on an external surface thereof so as to be non-annular in configuration for the implements adjusting the polygonal rotation portion 216. Therefore, the laser module 20 can be adjusted after being set inside the cover 10 by squeezing the polygonal rotation portion 216.

The polygonal rotation portion 216 or the indented portion 212 of the base 21 is used for using the implements, so that the laser module 20 provide precise alignment for orientation.

The indented portion 212 is formed easily without limits for broad application.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A laser module with adjustable laser beam, comprising:
   a hollow base having a front portion and a rear portion, and including an indented portion formed at said rear portion of said hollow base and having a non-annular configuration, said hollow base further having an internal surface and an external surface, an external threaded portion and an internal threaded portion being formed at said external and internal surfaces of said hollow base, respectively, at said front portion thereof;
   a front sleeve, said front sleeve including a threaded portion formed at an external surface thereof, said front sleeve being attached to said hollow base by rotative engagement between said internal threaded portion of said hollow base and said threaded portion of said first sleeve, respectively;
   a lens attached to said first sleeve and disposed inside the hollow base in proximity to said front portion thereof;
   a laser diode disposed inside the hollow base in proximity to said rear portion thereof;
   a printed circuit board electrically connected to the laser diode;
   a spring disposed within said hollow base between said lens and said laser diode;
   a lens holder having a threaded portion formed at an internal surface thereof, said lens holder being attached to said hollow base by rotative engagement between said external threaded portion of said hollow base and said threaded portion of said lens holder; and
   a prism disposed at said lens holder.

2. The laser module as claimed in claim 1, wherein the indented portion includes a recess formed on the hollow base.

3. The laser module as claimed in claim 1, wherein the indented portion includes a through hole formed in the hollow base.

4. The laser module as claimed in claim 1, wherein the lens holder is screwed to said front portion of the hollow base.

5. The laser module as claimed in claim 1, wherein the lens holder is tightly sleeved to said front portion of the hollow base.

6. The laser module as claimed in claim 1, wherein the printed circuit board is disposed outside the hollow base.

7. The laser module as claimed in claim 1, wherein the printed circuit board is disposed inside the hollow base.

8. The laser module as claimed in claim 1, wherein the hollow base includes a front base and a rear base.

9. A laser module with adjustable laser beam, comprising:
   a hollow base having a front portion and a rear portion, and including a polygonal rotation portion disposed on an external surface thereof, said polygonal rotation portion having a non-annular configuration, said hollow base further having an internal surface and an external surface, an external threaded portion and an internal threaded portion being formed at said external and internal surfaces of said hollow base, respectively, at said front portion thereof,
   a front sleeve, said front sleeve including a threaded portion formed at an external surface thereof, said front sleeve being attached to said hollow base by rotative engagement between said internal threaded portions of said hollow base and said threaded portion of said first sleeve, respectively;

a lens attached to said first sleeve and disposed inside the hollow base;

a laser diode disposed inside the hollow base in proximity to said rear portion thereof;

a printed circuit board electrically connected to the laser diode;

a spring disposed within said hollow base between said lens and said laser diode; and a lens holder having a threaded portion formed at an internal surface thereof, said lens holder being attached to said hollow base by rotative engagement between said external threaded portion of said hollow base and said threaded portion of said lens holder.

10. A laser module with adjustable laser beam, comprising:

a hollow base having a front portion and a rear portion, and including a portion having a non-annular configuration and formed at said rear portion of said hollow base, said hollow base further having an internal surface and an external surface, an external threaded portion and an internal threaded portion being formed at said external and internal surfaces of said hollow base, respectively, at said front portion thereof;

a front sleeve, said front sleeve including a threaded portion formed at an external surface thereof, said front sleeve being attached to said hollow base by rotative engagement between said internal threaded portion of said hollow base and said threaded portion of said first sleeve, respectively;

a lens attached to said first sleeve and disposed inside the hollow base in proximity to said front portion thereof;

a laser diode disposed inside the hollow base in proximity to said rear portion thereof;

a printed circuit board electrically connected to the laser diode;

a spring disposed within said hollow base between said lens and said laser diode;

a lens holder having a threaded portion formed at an internal surface thereof, said lens holder being attached to said hollow base by rotative engagement between said external threaded portion of said hollow base and said threaded portion of said lens holder; and a prism disposed at said lens holder, wherein a relative disposition between said laser diode and said lens is adjusted by rotative motion of said front sleeve relative to said hollow base, and wherein a relative disposition between said laser diode and said prism is adjusted by rotative motion of said hollow base relative to said lens holder.

11. The laser module as claimed in claim 10, wherein said portion of non-annular configuration includes an indented portion.

12. The laser module as claimed in claim 10, wherein said portion of non-annular configuration includes a polygonal rotation portion.

* * * * *